(12) United States Patent
Yamamoto et al.

(10) Patent No.: US 6,292,139 B1
(45) Date of Patent: Sep. 18, 2001

(54) ELECTRONIC PART AND A METHOD OF MANUFACTURING THE SAME

(75) Inventors: Keizo Yamamoto, Osaka; Kazuhisa Yamaki; Yuichi Kushihi, both of Kanazawa, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/291,848

(22) Filed: Apr. 14, 1999

(30) Foreign Application Priority Data

Apr. 15, 1998 (JP) .................................... 10-105015

(51) Int. Cl.$^7$ ...................................................... H01Q 1/24
(52) U.S. Cl. .................... 343/700 MS; 430/315
(58) Field of Search ............. 343/700 MS, 895; 216/6, 13; 430/315, 324

(56) References Cited

U.S. PATENT DOCUMENTS

| | | | |
|---|---|---|---|
| 5,112,726 | * 5/1992 | Cohen et al. | 430/315 |
| 5,597,494 | * 1/1997 | Kohno et al. | 216/6 |
| 5,999,146 | * 12/1999 | Kanba et al. | 343/895 |

OTHER PUBLICATIONS

Database WPI, week 199821, Derwent Publications Ltd., London, GB, Class L03, AN 1998–236487; & JP 10 074665 A (Murata), abstract.

Patent Abstracts of Japan, vol. 95, No. 2, Mar. 31, 1995; & JP 06 310371 A (Murata), Nov. 4, 1994, abstract.

Patent Abstracts of Japan, vol. 96, No. 6, Jun. 28, 1996; & JP 08 031695 A (Murata), Feb. 2, 1996, abstract.

Patent Abstracts of Japan, vol. 98, No. 2, Jan. 30, 1998; & JP 09 260210 A (NGK Insulators), Oct. 3, 1997, abstract.

* cited by examiner

*Primary Examiner*—Don Wong
*Assistant Examiner*—James Clinger
(74) *Attorney, Agent, or Firm*—Ostrolenk, Faber, Gerb & Soffen, LLP

(57) ABSTRACT

The invention provides an electronic part comprising an electronic-part body comprising: composite-material body made of synthetic resin in which ceramic powder as a functional material and a catalytic agent to make plating practicable are dispersed; and a layer of composite material of synthetic resin in which ceramic powder as a functional material is dispersed, said layer covering the external surface of said composite-material body except the portion in which an electrode is to be disposed; and an electrode disposed on the external surface of said electronic-part body. The above described electronic part is excellent in the freedom of shape, high in dimensional accuracy, and it is easy to realize the intended electrical characteristics.

19 Claims, 5 Drawing Sheets

ELECTRONIC PART AND A METHOD OF MANUFACTURING THE SAME

BACKGROUND OF THE INVENTION

1. Field of the Invention

The present invention relates to an electronic part to be used for various purposes, for example, such as dielectric antennas and coil parts and a method of manufacturing such electronic part, and more particularly to an electronic part using composite materials made up of synthetic resin and ceramic powder as a functional material and a method of manufacturing such electronic part.

2. Description of the Related Art

Ceramics and synthetic resin have been widely used as materials constituting electronic parts.

However, when ceramics is used, it was difficult to easily obtain electronic parts which are not uniform in shape because the electronic parts are formed by firing. For example, in Japanese Unexamined Utility Model Publication No. 5-55529, an electronic part made up of ceramics and having a three-dimensional form is shown. These use a sintered ceramic material in which a portion requiring plating is composed of a ceramic material having a catalytic action so that the portion is able to be plated and a portion not requiring plating is composed of a ceramic material not allowing plating. Therefore, even if a sintered material of a complicated three-dimensional shape is used, it is understood to be able to form electrodes in required portions by electroless plating without fail. Further, it is indicated that capacitors, etc. are able to be formed on a three-dimensional circuit board by making use of the dielectric constant of ceramics. However, because ceramics is used, complicated processes were required to realize the three-dimensional shape, and the dimensional overall accuracy of the three-dimensional electronic part thus obtained was not sufficient.

On the other hand, a method of manufacturing three-dimensional circuit boards using synthetic resin has been proposed. For example, Japanese Unexamined Patent Publication No. 63-128181 and Japanese Patent No. 2603828, disclose a method of obtaining three-dimensional circuit boards in such a way that a molded product is obtained through two molding processes by using resin containing a catalytic agent such as palladium so as to be plated and resin not allowing plating and on the molded product electrodes are formed by a photolithography or a common method of plating. By these methods, it is possible to obtain highly precise circuit boards of a three-dimensional shape as the synthetic resin is excellent in moldability. However, these three-dimensional circuit boards using the synthetic resin were used only to support conductive paths, and the electrical properties of the synthetic resin such as dielectric constant, permeability, etc. were not used in a positive way.

Further, Japanese Unexamined Patent Publication No. 3-4581, discloses a composite circuit of a board integrally formed by using composite resin materials of synthetic resin with ceramic powder dispersed therein. The board is composed of a first part made up of composite materials of resin with dielectric ceramic powder dispersed therein, and a second part made up of composite materials of resin with magnetic ceramic powder dispersed therein, that is, the board is constructed so as to have first and second parts which have electrical properties different from each other. The composite circuit is realized by first and second circuit elements which are composed of the first and second parts. However, the first and second circuit elements are only made up of the first and second parts, respectively.

That is, so far chip-type electronic parts making use of the electric properties and having easy moldability of synthetic resin has not been known.

SUMMARY OF THE INVENTION

An object of the present invention is to present a new electronic part making use of not only the easy moldability, but also the electrical properties of synthetic resin and a method of manufacturing such electronic part.

The present invention provides an electronic part, comprising an electronic-part body comprising: a composite-material body made of synthetic resin in which ceramic powder as a functional material and a catalytic agent to make plating practicable are dispersed; and a layer of composite material of synthetic resin in which ceramic powder as a functional material is dispersed, said layer covering the external surface of said composite-material body except a portion in which an electrode is to be disposed; and an electrode disposed on the external surface of said electronic-part body.

According to the above described structure and arrangement, as the electronic part is made up of composite material of synthetic resin with functional ceramic powder or whisker dispersed therein, the electronic part is able to be made lightweight, and at the same time as the composite materials are excellent in moldability, electronic parts being excellent in their dimensional accuracy and having various forms are able to be easily obtained. Accordingly, electronic parts different in shape are able to be easily presented. Further, by adjustment of the kinds and mixing ratio of the above-mentioned synthetic resin and ceramic powder as a functional material or whisker, the desired electrical properties are able to be easily realized.

Compared with electronic parts using conventional sintered ceramic material, electronic parts having various shapes and electrical properties are able to be easily presented when required.

In the above described electronic part, said ceramic powder as a functional material may be selected from the group consisting of dielectric ceramic powder and magnetic ceramic powder.

According to the above described structure and arrangement, a dielectric ceramic powder or magnetic ceramic powder is used as the ceramic powder of a functional material. Accordingly when, for example, dielectric ceramic powder is used, it is possible to present capacitors and dielectric antennas. When a magnetic ceramic powder is used, it is possible to present coil parts and other parts.

Said electronic part may be made up of synthetic resin in which dielectric ceramic powder is dispersed, and a plurality of said electrodes are disposed on the external surface of said electronic-part body to thereby said electronic part constitutes a dielectric antenna. According to the above structure and arrangement, a dielectric antenna which is lightweight and highly dimensionally accurate and has desired characteristics is able to be easily presented.

Said electronic part may be made up of synthetic resin in which a magnetic ceramic powder is dispersed, and said electrode is disposed on the external surface of said electronic-part body to thereby constitute a coil part. According to this above described structure and arrangement, the coil part which is lightweight and excellent in dimensional accuracy and the desired inductance is able to be easily presented.

The present invention further provides a method of manufacturing an electronic part, comprising the steps of: obtaining a primary molded product made up of synthetic resin in which ceramic powder as a functional material and a catalytic agent to make plating practicable are dispersed; obtaining a secondary product by forming a layer of composite material of synthetic resin in which ceramic powder as a functional material is dispersed so as to cover a portion of the external surface of the primary molded product except the portion in which an electrode is to be formed; and plating the portion of the secondary molded product except the portion in which the layer of composite material is formed, and forming an electrode thereon.

According to the above described method, when on the external surface of the secondary molded product electrodes are formed by plating, the layer of composite materials is not able to be plated and acts as a mask and accordingly, electrodes are able to be easily and securely formed on the portion in which the layer of composite materials is not formed. In consequence, each of the above described electronic parts of the present invention is able to be easily produced.

In the above described method, said ceramic powder as a functional material may be selected from the group consisting of conventional dielectric ceramic powders and magnetic ceramic powders.

When a dielectric ceramic powder is used, dielectric elements such as dielectric antennas and capacitors are able to be easily presented, and when magnetic ceramic powder is used, inductance parts such as coil parts and similar parts are able to be easily presented.

Other features and advantages of the present invention will become apparent from the following description of the invention which refers to the accompanying drawings.

DETAILED DESCRIPTION OF THE INVENTION (First Preferred Embodiment)

Figure 1:
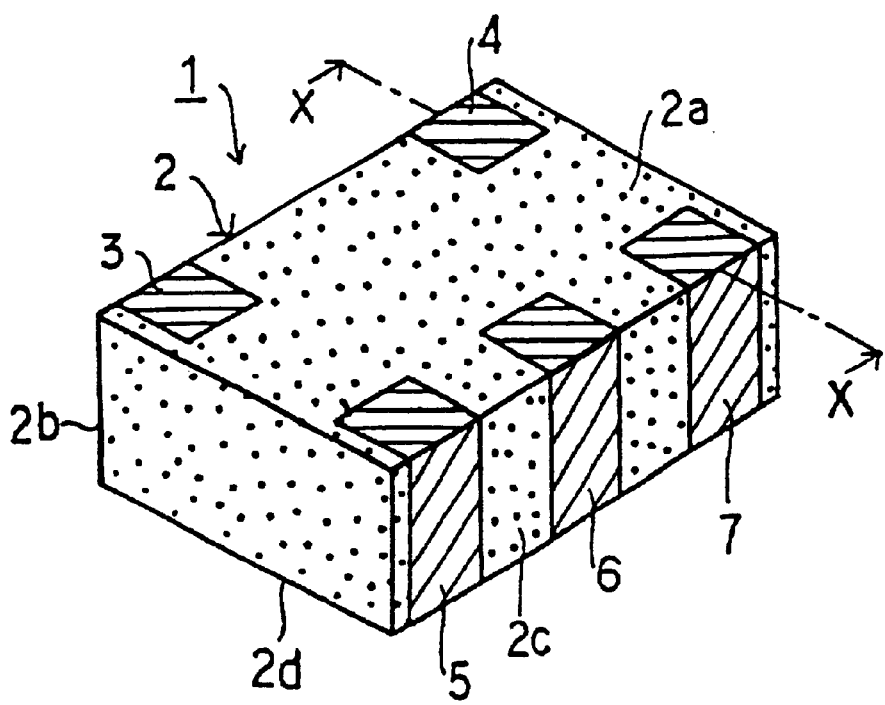
FIG. 1 is a perspective view showing a dielectric antenna as an electronic part relating to a first preferred embodiment of the present invention.

Referring to FIG. 1, the dielectric antenna 1 has an electronic-part body 2 in the form of a rectangular plate of synthetic resin in which dielectric ceramic powder and a catalytic agent to make plating practicable are dispersed. The above-mentioned synthetic resin and dielectric ceramic powder are not particularly limited, and each of materials is chosen so as to have an appropriate dielectric constant in order to construct the dielectric antenna 1.

As the above-mentioned synthetic resin, for example, syndiotatic polystyrene (SPS), liquid crystal polymer (LCP), etc. can be used, and as the dielectric ceramic powder, $CaTiO_3$, $BaTiO_3$, etc. can be used.

Also, the ratio of dielectric ceramic powder to the synthetic resin in which the dielectric ceramic powder is to be dispersed is not particularly limited, but the dielectric ceramic powder is preferably about 70 vol. % or less of the total synthetic resin and more preferably about 50 vol. % or less when moldability of the electronic part is taken into consideration. When the content of the dielectric ceramic powder exceeds about 70 vol. %, the moldability may be impaired.

In the first preferred embodiment, the relative dielectric constant of the composite materials constituting the above-mentioned electronic-part body 2 is made to be about 4 to 20. In order to realize this relative dielectric constant, the kinds and mixing ratio of the above-mentioned synthetic resin and dielectric ceramic powder are appropriately chosen.

On the external surface of the electronic-part body 2, electrodes 3 through 7 are formed. The electrodes 3 through 7 are formed so as to extend from the upper surface 2a to the lower surface 2d through the side surfaces 2b, 2c of the electronic-part body 2.

The electrodes 3 through 7 are formed so as to constitute a chip-type dielectric antenna, and the form shown in the drawing is not particularly limited thereto. That is, as for the number and form of electrodes, they are appropriately chosen in accordance with the intended dielectric antenna. Further, a more concrete example of a chip-type dielectric antenna is explained in a second embodiment described later.

The electrodes 3 through 7 can be formed in an appropriate method such as plating, vacuum evaporation, sputtering, etc. The materials constituting the electrodes 3 through 7 are not particularly limited and an appropriate metal or alloy of Ag, Cu, Ni, Al, etc. can be used.

As the electronic-part body 2 is composed of composite materials of synthetic resin with dielectric ceramic powder dispersed therein, it is possible to be make the chip-type antenna 1 lightweight in comparison with that made of sintered ceramic materials. In addition, as the moldability is excellent, it is possible to obtain antennas of various forms and at the same time to heighten their dimensional accuracy compared with antennas of sintered ceramic materials. Further, by changing the kinds of synthetic resin and dielectric ceramic powder and their mixing ratio, it is possible to easily realize a desired relative dielectric constant and to easily present a dielectric antenna giving desired electrical properties.

The method of manufacturing the dielectric antenna 1 is not particularly limited and after the electronic-part body 2 has been constructed, the electrodes 3 through 7 may be formed in an appropriate way. However, preferably the manufacturing method to be explained with reference to FIGS. 2 through 4 may be well used.

Figure 2:
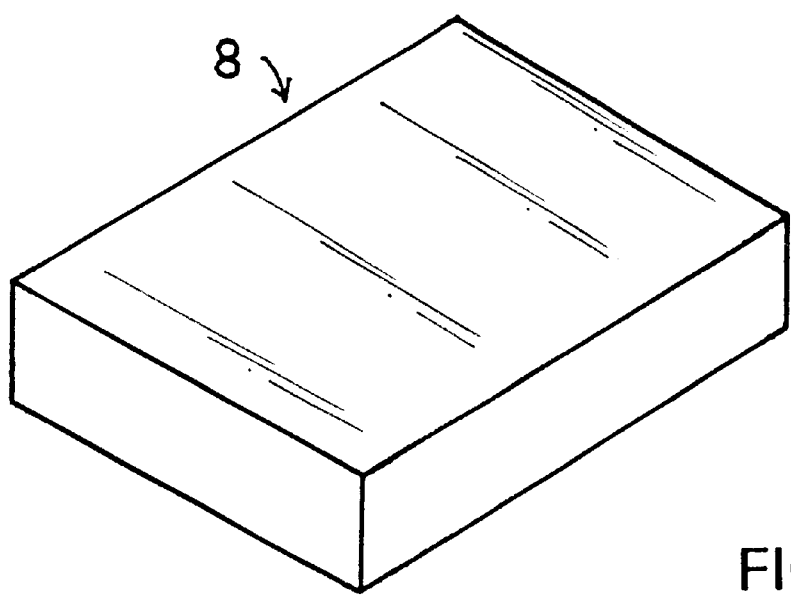
FIG. 2 is a perspective view showing a primary molded product to be used for manufacturing a dielectric antenna of a first preferred embodiment.

In this preferable manufacturing method, first of all, a primary molded product 8 shown in a perspective view of FIG. 2 is obtained. The primary molded product 8 is obtained by an appropriate molding method such as injection molding using composite materials of synthetic resin with dielectric ceramic powder and a catalytic agent to make plating practicable which are dispersed therein. As the above-mentioned catalytic agent, an appropriate catalytic agent making it possible to form the 3 to 7 electrodes on the external surface of the electronic-part body 2 by plating can be used. These catalytic agents are not particularly limited, and palladium and gold can be named, for example.

Next, a layer of composite material of synthetic resin with dielectric ceramic powder dispersed therein is formed so as to cover a portion on the external surface of the primary molded product 8 except the portion in which the electrodes 3 through 7 are to be formed, to obtain a secondary product.

Figure 3:
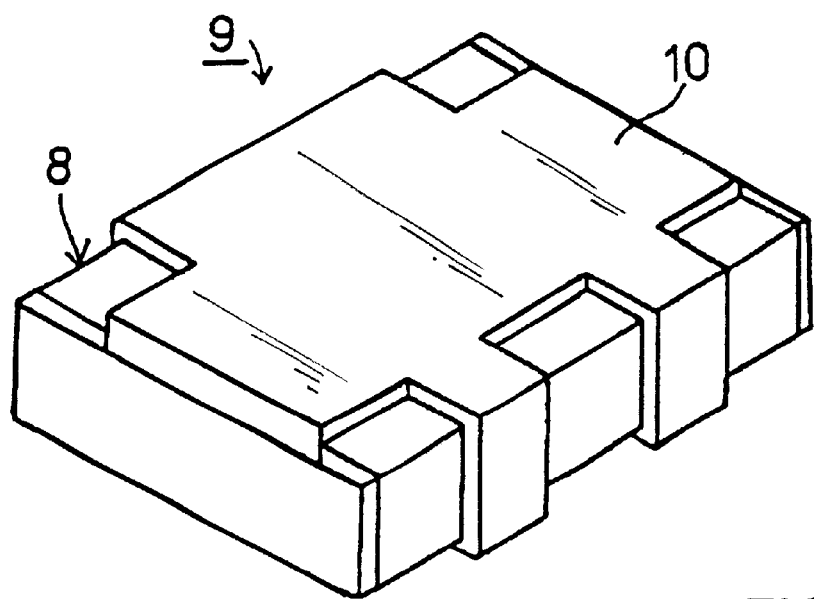
FIG. 3 is a perspective view showing a secondary molded product made up of the primary molded product shown in FIG. 2 on the external surface of which a layer of composite material is formed.
Figure 4:
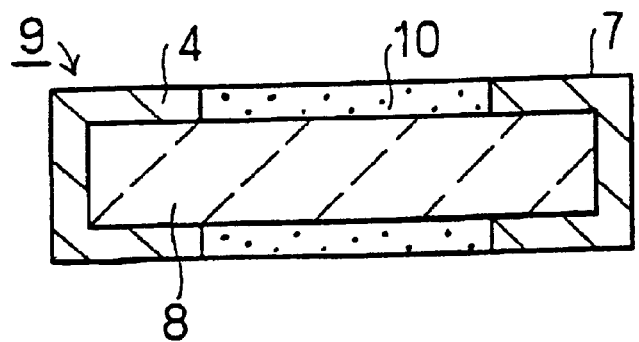
FIG. 4 is a sectional view taken on line X—X in FIG. 1.

A secondary molded product obtained in this way is shown in FIG. 3. In the secondary molded product 9, a layer of composite material 10 is formed so as to cover body 8 except the portion in which the electrodes 3 through 7 shown in FIG. 1 are to be formed. The layer of composite materials 10 does not contain catalytic agents, and accordingly the external surface of the layer of composite materials 10 cannot be plated. The layer of composite materials 10 is possible to be formed by arranging a primary molded product 8 in a molding die having protrusion portions corresponding to the portions in which the electrodes 3 through 7 are to be formed and by injecting composite materials. Also the layer of composite materials may be formed by coating molten composite materials on the external surface of a primary molded product 8 in the state that a mask with an opening portion except the portion in which the electrodes 3 through 7 are to be formed is contacted against the primary molded product 8, and by solidifying them by cooling. The concrete way of production is not particularly limited.

The electronic-part body 2 described above is composed of the secondary molded product 9 obtained in the above way. By plating above-mentioned metals on the external surface of the electronic-part body 2 thus obtained, the electrodes 3 through 7 are formed (See FIG. 4). In the external surface of the electronic-part body 2, that is, the above-mentioned secondary molded product 9, as only the external surface of the primary molded product 8 is able to be plated without using any mask, electrodes 3 through 7 are able to be easily formed by plating.

(Second Preferred Embodiment)

A second preferred embodiment is a more concrete example of a chip-type dielectric antenna according to the above-mentioned first preferred embodiment.

Figure 5:
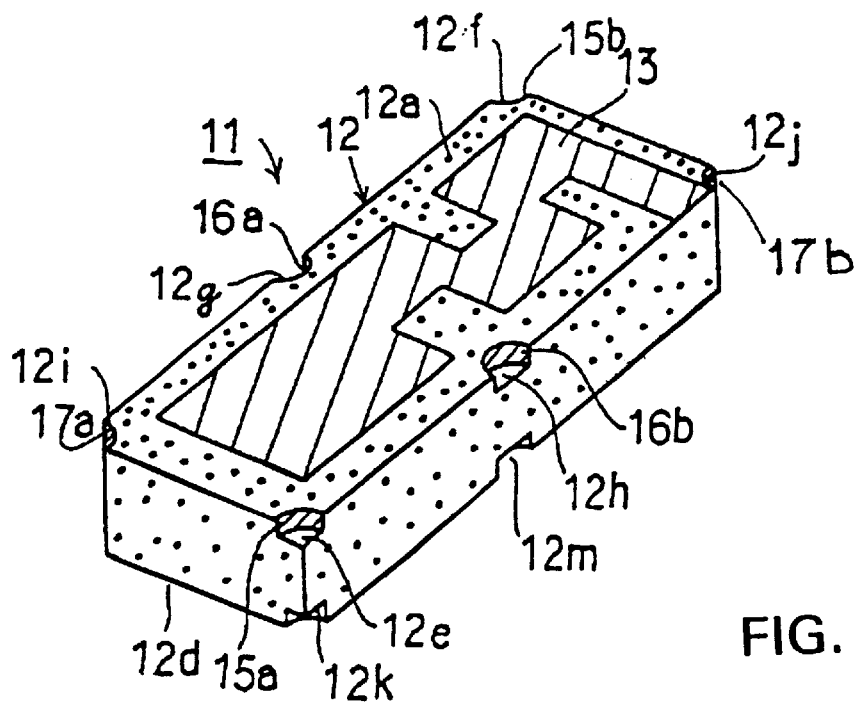
FIG. 5 is a perspective view of a dielectric antenna as an electronic part relating to a second preferred embodiment of the present invention.
Figure 6:
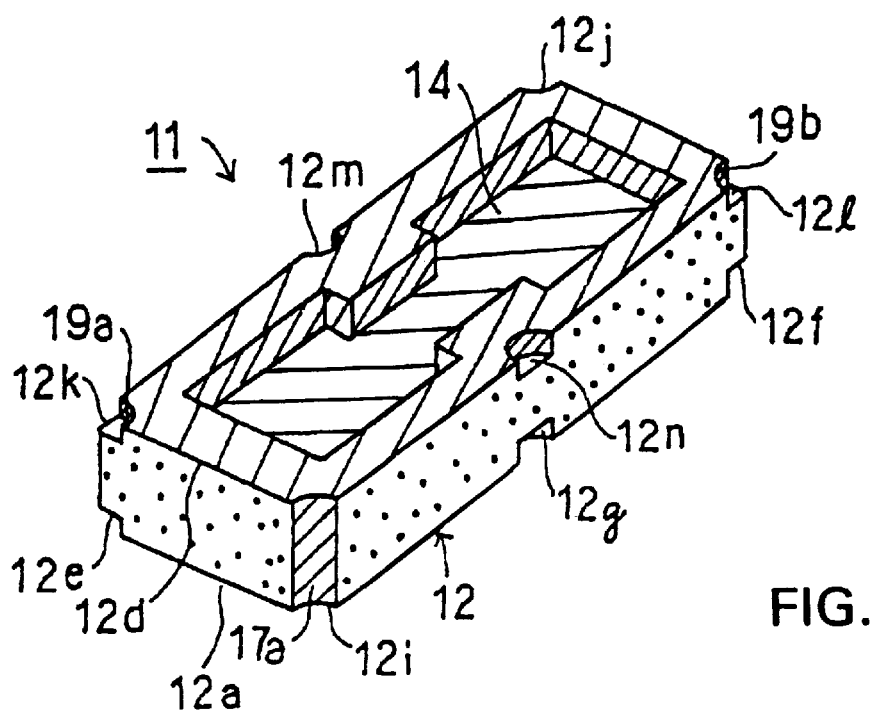
FIG. 6 is a perspective view of a dielectric antenna shown in FIG. 5 turned upside down.

Referring to FIGS. 5 and 6, the chip-type dielectric antenna 11 is composed of an electronic-part body 12 in the form of a rectangular plate. The electronic-part body 12 is made up of the same materials as those for the electronic-part body 2 in the first preferred embodiment.

On the upper surface 12a of the electronic-part body 12, an electrode 13 is formed. Also, on the lower surface 12d, an electrode 14 is formed. More, a concave portion is formed in the middle of the lower surface of the electronic-part body 12, and the electrode 14 is formed on the whole surface of the lower surface so as to extend inside the concave portion.

In the upper surface 12a of the electronic-part body 12, a pair of corner portions facing each other in the diagonal direction have cut portions 12e, 12f formed respectively, and in the cut portions 12e, 12f electrodes 15a, 15b are formed.

In the middle of the long side edge on the upper surface 12a, cut portions 12g, 12h are formed so as to face each other in the width direction, and in the cut portions 12g, 12h, electrodes 16a, 16b are formed.

In another pair of corner portions facing each other in the diagonal direction on the upper surface 12a, cut portions 12i, 12j which are cut through in the thickness direction of the electronic-part body 12 are formed, and in the cut portions 12i, 12j, electrodes 17a, 17b are formed. The electrodes 17a, 17b are electrically connected to the electrode 14 formed on the lower surface 12d of the electronic-part body 12.

Also on the side of the lower surface 12d, in another pair of corner portions different from the corner portions in which the electrodes 17a, 17b are formed, cut portions 12k, 12l are formed respectively. In the cut portions 12k, 12l, electrodes 19a, 19b are formed respectively, and the electrodes 19a, 19b are electrically connected to the electrode 14.

Also on the lower surface 12d, cut portions 12m, 12n are formed in the middle of the edge extending in the long side direction, and the electrode 14 is formed so as to extend in the cut portions 12m, 12n. Further, the cut portions 12m, 12n are made to face the cut portions 12g, 12h formed on the side of the upper side in the thickness direction respectively.

Figure 7:
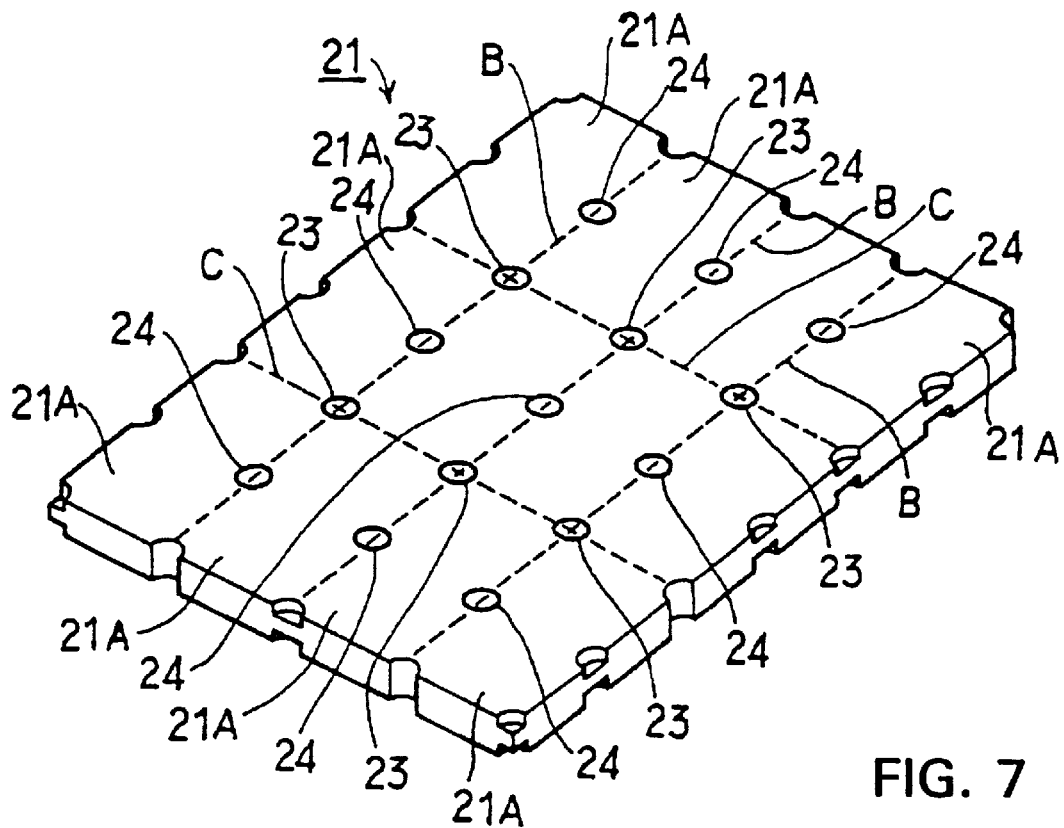
FIG. 7 is a perspective view to explain a mother board prepared in the manufacture of a second preferred embodiment.

In the manufacture of the above dielectric antenna 11, first of all, a mother board 21 in a rectangular shape is prepared, as shown in a perspective view of FIG. 7. The mother board 21 is formed in an appropriate method of molding such as injection molding using a composite material of synthetic resin with dielectric ceramic powder dispersed therein. In the mother board 21, a plurality of through-holes 23 shown by a plus mark and holes 24 shown by a minus mark in FIG. 7 are formed. The through holes 23 are formed so as to penetrate the mother board 21 in the thickness direction, and the holes 24 are formed so as to have a bottom surface. In the portions in which the holes 24 are formed, holes extended from the side of the lower surface and having a bottom surface are also formed.

In the composite material of synthetic resin and ceramic powder as a functional material constituting the mother board 21, catalytic agents are dispersed so that the mother board 21 is able to be plated as described earlier.

Next, primary molded products 21 are obtained by cutting the mother board 21 along broken lines B, C in FIG. 7. All the external surface of the primary molded products 21A can be plated.

Figure 8:
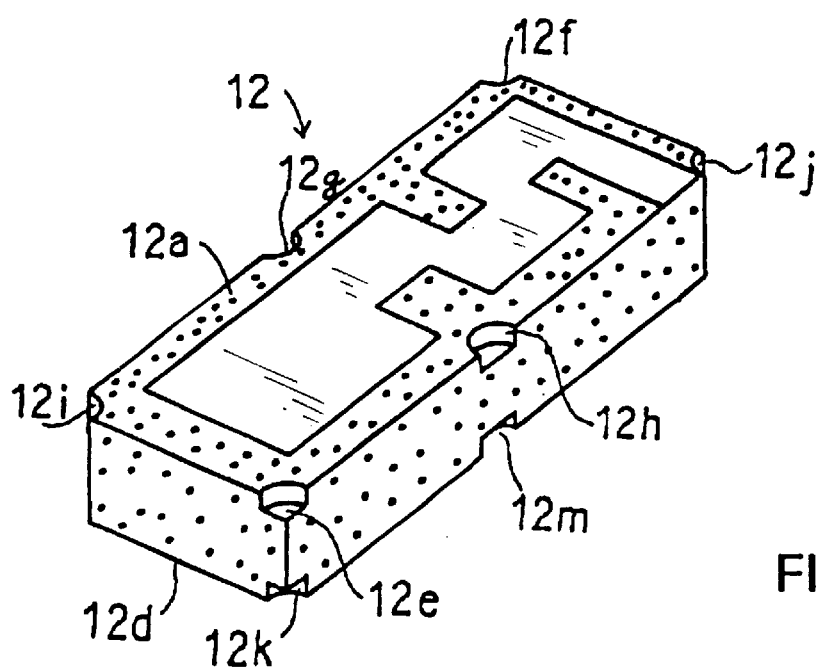
FIG. 8 is a perspective view showing an electronic part as a secondary molded product prepared in the manufacture of a dielectric antenna of a second preferred embodiment.
Figure 9:
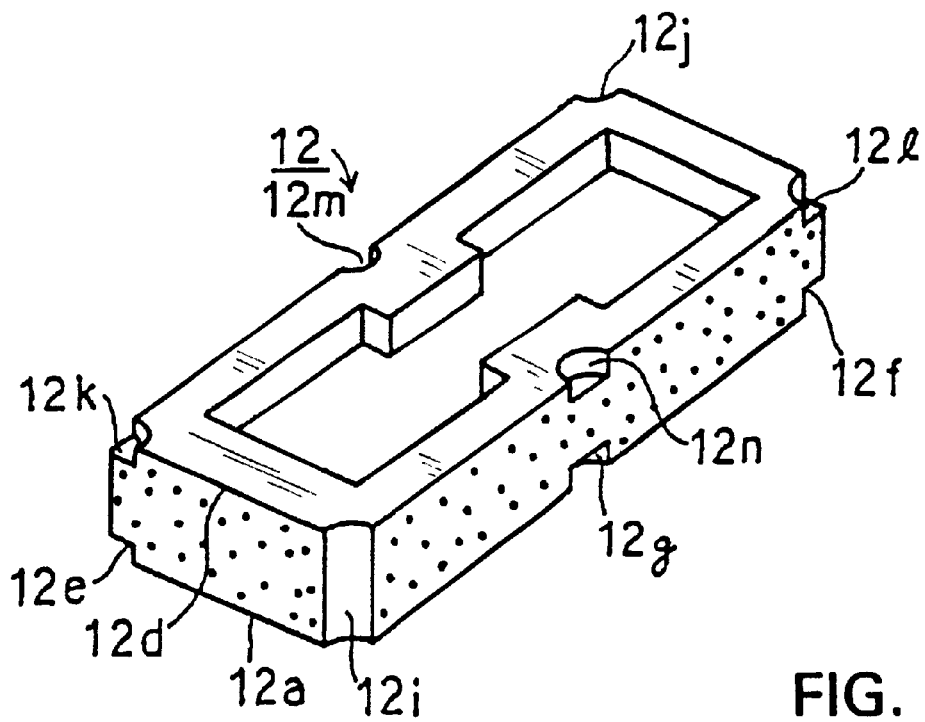
FIG. 9 is a perspective view looked at from the side of the lower surface of the electronic part shown in FIG. 8.

Next, by forming a layer of composite material of synthetic resin with dielectric ceramic powder dispersed therein so as to cover the portion of the external surface of the primary molded product 21A except the portion to be plated in which the above-mentioned electrodes are formed, the electronic-part body 12 shown in FIG. 8 is obtained. In FIG. 8, the portion of the electronic-part body 12 which is not covered by a layer of composite material, that is, the portion in which each of the above-mentioned electrodes is to be formed is shown free of dots.

Next, by plating metal materials such as Ag, Cu, etc. on the external surface of the above-mentioned electronic-part body 12, the chip-type dielectric antenna 11 shown in FIGS. 5 and 6 is obtained. In this case, the portion not covered by a layer of composite material is plated, but the portion covered by a layer of composite material is not capable of being plated. Accordingly, as in the case of the first preferred embodiment, without using any mask, each of the electrodes is able to be easily formed by plating.

(Third Preferred Embodiment)

The third preferred embodiment is to be applied to a coil part.

Figure 10:
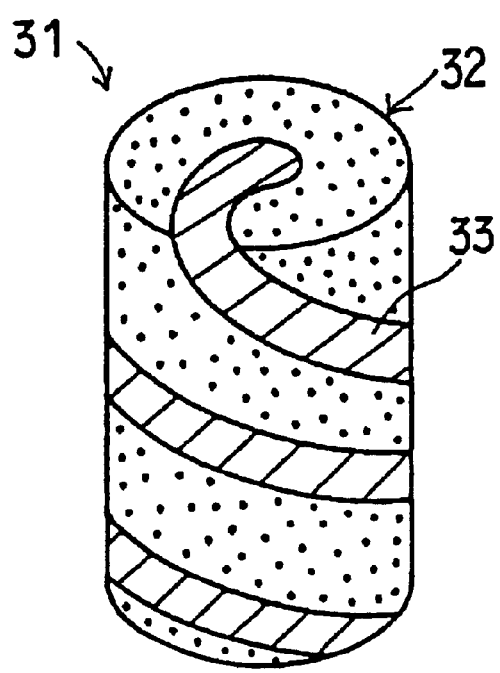
FIG. 10 is a perspective view of a coil as an electronic part relating to a third preferred embodiment.

Referring to FIG. 10, the coil part 31 is composed of a coil-shaped electrode 33 formed on the external surface of a cylindrical electronic part 32. The electronic part 32 is made up of a composite material of synthetic resin with magnetic ceramic powder dispersed therein. As the synthetic resin, for example, polyphenylene sulphide, LCP, etc. can be used although they are not particularly limited thereto. Further, as the magnetic ceramic powder, appropriate ferrite powders such as the NiZn group, MnZn group, etc. is able to be preferably used although they are not particularly limited thereto.

When the ferrite powder is dispersed into synthetic resin, the mixing ratio is not particularly limited and is chosen so as to realize the permeability required for the coil part 31.

Preferably, when polyphenylene sulphide is used as synthetic resin and NiZn group ferrite powder as ferrite powder, the content of ferrite powder is preferably about 70 vol. % or less, and more preferably about 50 vol. % or less. If the content exceeds about 70 vol. %, when the electronic part 32 is formed using the above-mentioned composite materials, the moldability may be impaired.

Regarding the permeability of the composite materials constituting the above-mentioned electronic part 32, the permeability $\mu$ is made to be about 10 in the present embodiment, although the permeability is appropriately determined in accordance with the intended coil part.

The coil-shaped electrode 33 is able to be formed by plating an appropriate metal or alloy such as Ag, Cu, Ni, etc. In the same way as the first and second embodiments, when the electronic part 31 is obtained, preferably used is a method of obtaining a primary molded product by using composite materials with a catalytic agent dispersed therein so that the surface of the primary molded product can be plated, of obtaining a secondary molded product by covering a portion of the external surface of the primary molded product except the portion in which the electrode 33 is to be formed with composite materials, and of plating the external surface of the secondary molded product.

The above-mentioned manufacturing method making use of a layer of composite material as a mask for not allowing the portion not requiring plating to be exposed is able to be well used. However, the manufacturing method of the coil part 31 is not particularly limited in the third embodiment either.

As the electronic part 32 is made up of composite materials of synthetic resin with magnetic ceramic powder dispersed therein, the coil part 31 of the present embodiment is able to be made lightweight, and the shape of the electronic part 32 is able to be easily changed and the dimensional accuracy is able to be improved. In addition, by changing the kinds and mixing ratio of the synthetic resin and magnetic ceramic powder, a desired permeability can be easily realized.

(Other Embodiments)

In the first through third preferred embodiment, examples in which the dielectric ceramic powder and magnetic ceramic powder were used as a functional ceramic powder were shown, but in the present invention, other functional ceramic powder such as piezoelectric ceramic powder, etc. may be used as a functional ceramic powder. Further, not only materials in powder for, but also whisker form may be used.

In addition, the method of forming electrodes on the electronic part is not particularly limited and other methods such as vacuum evaporation and sputtering may be used except plating.

In the first through third embodiment, the electrodes were formed only on the external surface of the electronic parts, but internal electrodes may also be formed inside the electronic parts.

While the invention has been particularly shown and described with reference to preferred embodiments thereof, it will be understood by those skilled in the art that the forgoing and other changes in form and details may be made therein without departing from the spirit of the invention.

What is claimed is:

1. An electronic part comprising:
   an electronic-part body comprising a first composite material which comprises synthetic resin having ceramic functional material and a catalytic agent to make plating practicable dispersed therein, said body having an external surface, and a layer of a second composite material comprising synthetic resin having ceramic functional material dispersed therein, said layer of second composite material covering the external surface of said first composite material body except that portion at which an electrode is disposed; and
   at least one electrode disposed on the external surface of said electronic-part body.

2. The electronic part according to claim 1, wherein said ceramic functional material is selected from the group consisting of dielectric ceramic, magnetic ceramic and piezoelectric ceramic.

3. The electronic part according to claim 2, wherein the ceramic is about 70 vol. % or less of the synthetic resin in each of said composite materials.

4. The electronic part according to claim 3, wherein the ceramic is about 50 vol. % or less of the synthetic resin in each of said composite materials.

5. The electronic part according to claim 3, wherein said electronic part is a dielectric antenna and the ceramic is a dielectric ceramic.

6. The electronic part according to claim 5, wherein the dielectric constant of each of said composite materials is about 4 to 20.

7. The electronic part according to claim 3, wherein said electronic part comprises a coil and the ceramic is a magnetic ceramic.

8. The electronic part according to claim 7, wherein said synthetic resin is polyphenylene sulphide and the ceramic is a NiZn ferrite.

9. The electronic part according to claim 1, wherein said electronic part is a dielectric antenna and the ceramic is a dielectric ceramic.

10. The electronic part according to claim 1, wherein said electronic part comprises a coil and the ceramic is a magnetic ceramic.

11. The electronic part according to claim 1, wherein said ceramic is in powder or whisker form.

12. A method of manufacturing an electronic part comprising the steps of:
    providing a molded product comprising synthetic resin having ceramic functional material and a catalytic agent to make plating practicable dispersed therein;
    forming a layer of composite material comprising synthetic resin having ceramic functional material dispersed therein so as to cover a portion the external surface of the molded product except for the portion at which an electrode is to be formed to form a second product; and
    plating a portion of the second product not covered by said layer, and forming an electrode thereon.

13. The method according to claim 12, wherein said ceramic functional material is selected from the group consisting of dielectric ceramic, magnetic ceramic and piezoelectric ceramic.

14. The method according to claim 13, wherein the ceramic is about 70 vol. % or less of the synthetic resin in each of said composite materials.

15. The method according to claim 14, wherein the ceramic is about 50 vol. % or less of the synthetic resin in each of said composite materials.

16. The method according to claim 12, wherein said second product is in the form of an electroless dielectric antenna, the ceramic is a dielectric ceramic and at least two electrodes are formed so as to complete formation of the dielectric antenna.

17. The electronic part according to claim 12, wherein said second product is in the form of an electroless coil, the ceramic is a magnetic ceramic and the electrode formation completes formation of an electronic coil.

18. The method according to claim 12, wherein said ceramic is in powder or whisker form.

19. The method according to claim 18, including the step of molding a product comprising synthetic resin having ceramic functional material and a catalytic agent to make plating practicable dispersed therein.

* * * * *